(12) United States Patent
Lo et al.

(10) Patent No.: US 10,763,237 B2
(45) Date of Patent: *Sep. 1, 2020

(54) METHOD FOR MANUFACTURING ELECTRONIC PACKAGE

(71) Applicant: Siliconware Precision Industries Co., Ltd., Taichung (TW)

(72) Inventors: Yu-Min Lo, Taichung (TW); Chee-Key Chung, Taichung (TW); Chang-Fu Lin, Taichung (TW); Kuo-Hua Yu, Taichung (TW); Hsiang-Hua Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/691,477

(22) Filed: Nov. 21, 2019

(65) Prior Publication Data

US 2020/0091109 A1  Mar. 19, 2020

Related U.S. Application Data

(62) Division of application No. 15/980,255, filed on May 15, 2018, now Pat. No. 10,522,500.

(30) Foreign Application Priority Data

Feb. 14, 2018 (TW) .............................. 107105530 A

(51) Int. Cl.
*H01L 21/44* (2006.01)
*H01L 21/48* (2006.01)
(Continued)

(52) U.S. Cl.
CPC .......... *H01L 24/81* (2013.01); *H01L 21/4842* (2013.01); *H01L 21/4846* (2013.01); *H01L 24/11* (2013.01); *H01L 24/13* (2013.01); *H01L 24/16* (2013.01); *H01L 2224/1132* (2013.01); *H01L 2224/11462* (2013.01); *H01L 2224/11849* (2013.01); *H01L 2224/1301* (2013.01); *H01L 2224/13013* (2013.01); *H01L 2224/13014* (2013.01); *H01L 2224/16225* (2013.01); *H01L 2224/16245* (2013.01); *H01L 2224/81048* (2013.01); *H01L 2224/81191* (2013.01); *H01L 2224/81345* (2013.01); *H01L 2224/81801* (2013.01); *H01L 2224/81815* (2013.01);
(Continued)

(58) Field of Classification Search
CPC . H01L 21/4842; H01L 21/4846; H01L 24/11; H01L 24/81
USPC ............................................ 438/123
See application file for complete search history.

(56) References Cited

U.S. PATENT DOCUMENTS

2013/0149817 A1   6/2013   Jeon et al.
2016/0276236 A1   9/2016   Bang et al.
(Continued)

*Primary Examiner* — David S Blum
(74) *Attorney, Agent, or Firm* — Mintz Levin Cohn Ferris Glovsky and Popeo, P.C.; Peter F. Corless; Steven M. Jensen

(57) ABSTRACT

The present disclosure provides a method for manufacturing an electronic package, with an electronic component bonded to a carrier structure by means of solder tips formed on conductive bumps, wherein the solder tips do not require a reflow process to be in contact with the carrier structure, thereby allowing the conductive bumps to have an adequate amount of solder tips formed thereon and thus precluding problems such as cracking and collapsing of the solder tips.

12 Claims, 3 Drawing Sheets

(51) Int. Cl.
*H01L 21/50* (2006.01)
*H01L 23/00* (2006.01)

(52) U.S. Cl.
CPC ............... *H01L 2224/81948* (2013.01); *H01L 2924/3511* (2013.01); *H01L 2924/3512* (2013.01)

(56) References Cited

U.S. PATENT DOCUMENTS

2018/0315715 A1 11/2018 Chiu et al.
2018/0337083 A1 11/2018 Inada et al.

METHOD FOR MANUFACTURING ELECTRONIC PACKAGE

CROSS-REFERENCE TO RELATED APPLICATION(S)

This application is a divisional of copending application U.S. Ser. No. 15/980,255, filed on May 15, 2018, now U.S. Pat. No. 10,522,500, which claims under 35 U.S.C. § 119(a) the benefit of Taiwanese Application No. 107105530, filed Feb. 14, 2018, the entire contents of which are incorporated herein by reference.

BACKGROUND

1. Technical Field

The present disclosure relates to methods for manufacturing a package structure, and, more particularly, to a method for manufacturing a flip chip electronic package.

2. Description of Related Art

With the rapid development in electronic industry, electronic products nowadays are designed with compactness, lightweight, and multiple functions and various different packaging technologies have thus been developed. Among which, flip chip bonding technique has been specifically developed in order to satisfy the demands for semiconductor devices of high integration, miniaturization, high circuit performance, etc.

Flip chip bonding technology involves forming a plurality of metal bumps on an active face of a chip (or other types of semiconductor structures), such that the active face of the chip can be electrically connected to an external electronic device or a package substrate through these metal bumps. Such a design significantly reduces the overall volume of the package.

FIGS. 1A to 1C are cross-sectional views illustrating a conventional method for manufacturing a flip chip semiconductor package 1.

As shown in FIG. 1A, metal bumps 12 (e.g., copper pillars) are provided on an active face of a semiconductor chip 11. Then, solder tips are formed on the metal bumps 12. The solder tips are reflowed to form solder balls 13. Next, the semiconductor chip 11 and a package substrate 10 are separately pre-heated. Meanwhile, the package substrate 10 will exhibit warpage, and, thus, its left and right sides are upturned (as indicated by arrows A in FIG. 1A).

As shown in FIG. 1B, the semiconductor chip 11 is then bonded to the package substrate 10 through the solder balls 13.

As shown in FIG. 1C, a cooling process is performed. During the cooling process, the warpage of the package substrate 10 is mitigated, and the package substrate 10 gradually returns to take a generally flat shape.

However, in the conventional method for manufacturing the semiconductor package 1, during the cooling process, if there is insufficient amount of solder (especially at places where the degree of warpage is larger), then cracks, e.g., a crack k shown in FIG. 1C, may appear in the solder balls 13.

On the contrary, if the amount of solder is increased, a phenomenon called "solder collapse" may occur at the solder tips during reflow of the solder balls 13, resulting in the side walls of the metal bumps 12 being covered with the soldering material. This may lead to unbalanced stress in the subsequent manufacturing process, increasing the risks of creating cracks in the metal bumps 12 or the solder balls 13.

Therefore, there is a need for a solution that addresses the aforementioned issues in the prior art.

SUMMARY

In view of the aforementioned shortcomings of the prior art, the present disclosure provides a method for manufacturing an electronic package, which may include: providing an electronic component and a carrier structure, with a plurality of conductive bumps formed on the electronic component and a solder tip formed on each of the conductive bumps; and bonding the electronic component to the carrier structure via the solder tips with the solder tips being brought into contact with the carrier structure and free from going through a reflow process in advance.

In an embodiment, the electronic component is a flip chip semiconductor chip.

In an embodiment, the method further includes, before the solder tips are brought into contact with the carrier structure, pre-heating the carrier structure to allow the carrier structure to become warped. In an embodiment, the method further includes, after the solder tips are brought into contact with the carrier structure, performing a cooling process.

In an embodiment, the method further includes, before the solder tips are brought into contact with the carrier structure, heating the electronic component to allow the solder tips to become melted.

In an embodiment, the method further includes, after the solder tips are brought into contact with the carrier structure, heating the electronic component to allow the solder tips to become melted.

In an embodiment, the conductive bumps or the solder tips are formed by electroplating or screen printing.

In an embodiment, the thickness of the solder tips is greater than or equal to 15 μm.

In an embodiment, the solder tips are cylindrical or cubic, and have planar, arc or irregular surfaces.

In an embodiment, the carrier structure is a package substrate with a core layer and circuit structures. In another embodiment, the carrier structure is a coreless circuit structure, a lead frame, or a silicon interposer.

It can be understood from the above, the method for manufacturing the electronic package in accordance with the present disclosure allows the solder tips to come into contact with the carrier structure without a reflow process, so that a sufficient amount of solder at the solder tips can be provided on the conductive bumps without having to worry about the risk of solder collapsing at the solder tips and subsequently covering the side walls of the conductive bumps. Therefore, compared to the prior art, the method for manufacturing the electronic package according to the present disclosure eliminates unbalanced stress in the subsequent processes, thereby preventing cracks from forming in the conductive bumps or the solder tips.

Moreover, a sufficient amount of solder in the solder tips provides better bonding during thermal cycling (e.g., the pre-heating or heating process) to preclude the problem of cracking during the cooling process due to an insufficient amount of solder used in the solder tips.

The foregoing features and advantages of the present disclosure will become more apparent from the following detailed description taken in conjunction with the accompanying drawings. Additional features and advantages of the present disclosure will be set forth in part in the description which follows, or may be learned by practice of the disclosure. The features and advantages of the present disclosure are recognized and attained by means of elements and combinations thereof particularly specified in the appended claims. It should be understood that both the foregoing general description and the following detailed description are exemplary and explanatory only and are not intended to limit the scope of the disclosure as claimed.

BRIEF DESCRIPTION OF THE DRAWINGS

FIG. 2B' is a cross-sectional view illustrating a subsequent step following FIG. 2A in accordance with another embodiment.

DETAILED DESCRIPTION OF THE EMBODIMENTS

Figure 1A:
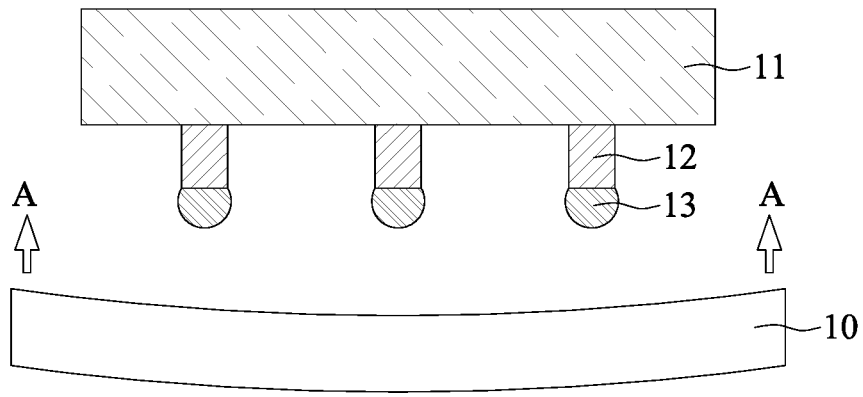
FIGS. 1A to 1C are cross-sectional views illustrating a conventional method for manufacturing a flip chip semiconductor package.
Figure 1B:
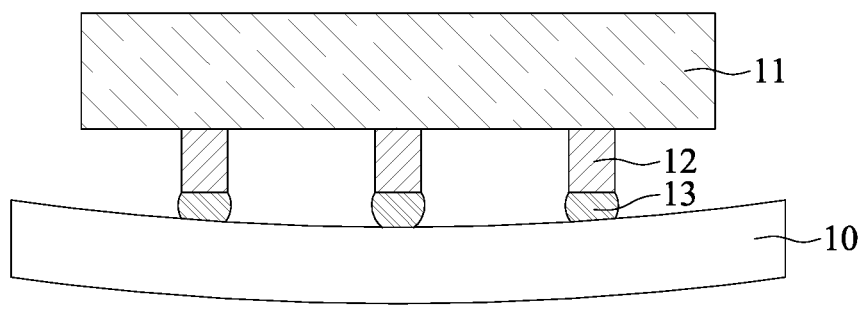
Figure 1C:
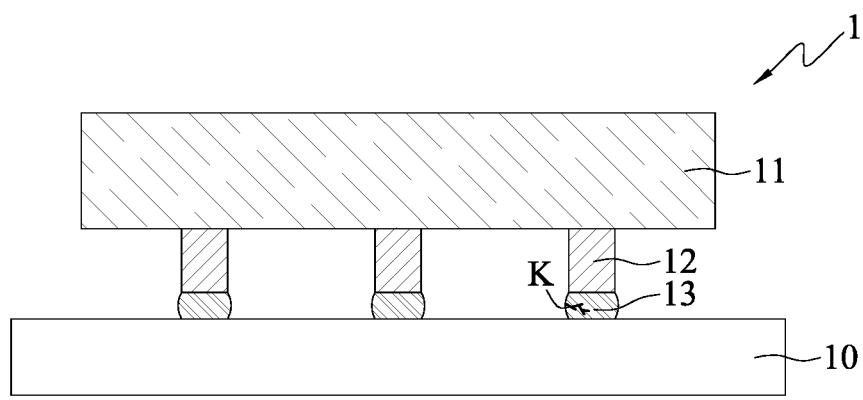

The technical content of present disclosure is described by the following specific embodiments. One of ordinary skill in the art can readily understand the advantages and effects of the present disclosure upon reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "below", "first", "second", "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2A:
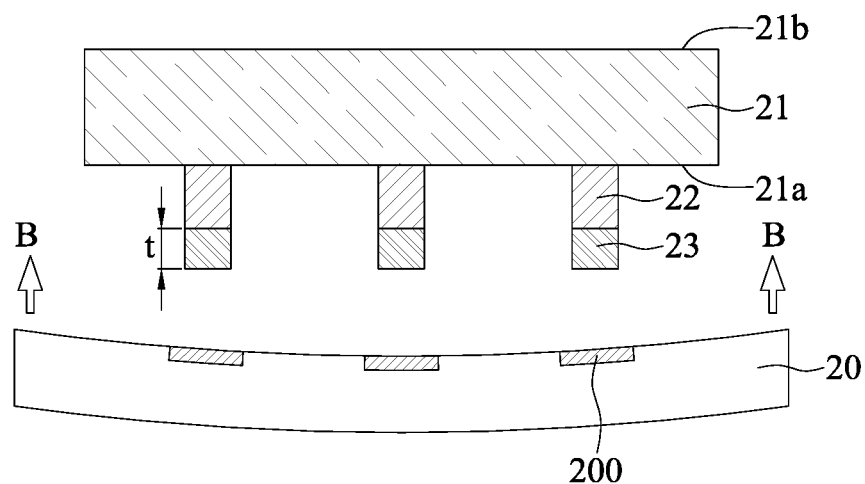
FIGS. 2A to 2C are cross-sectional views illustrating a method for manufacturing an electronic package in accordance with the present disclosure.
Figure 2B:
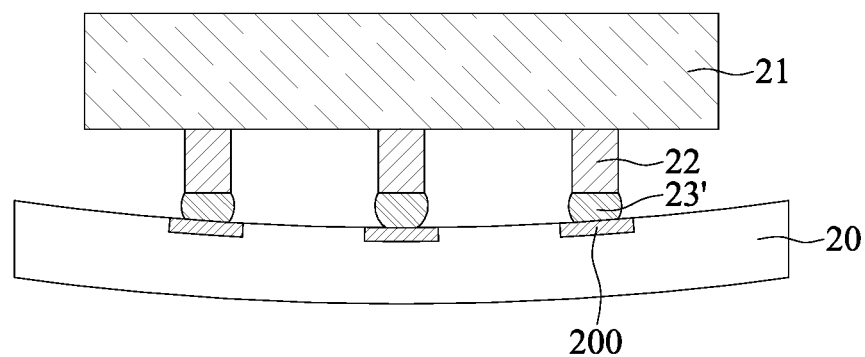
Figure 2B:
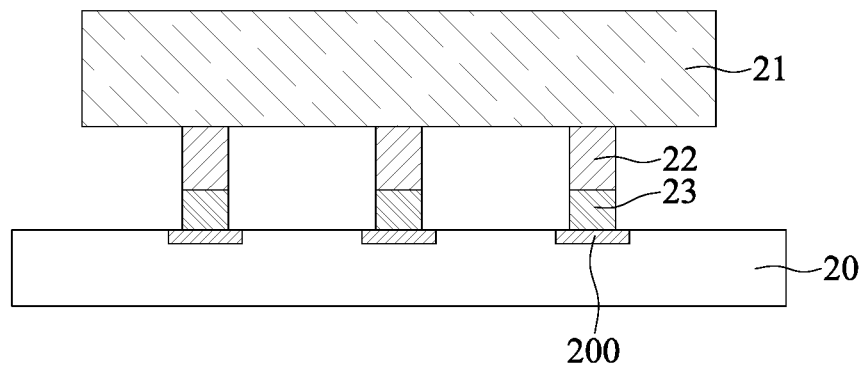
Figure 2C:
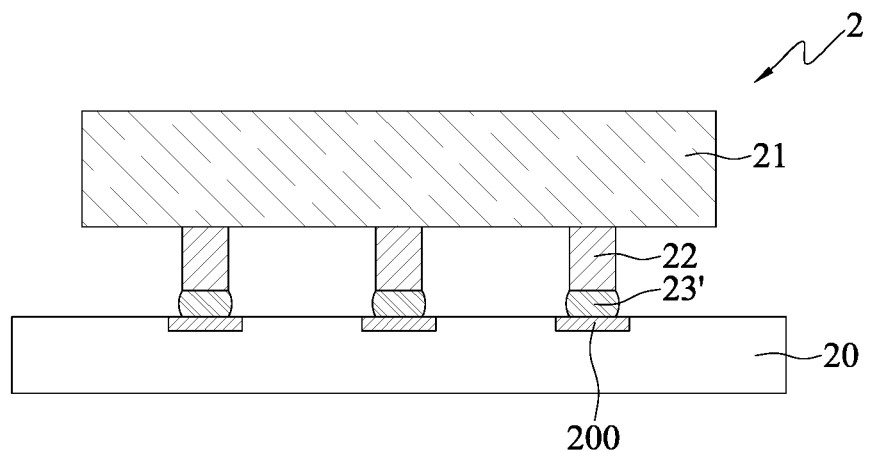

Referring to FIGS. 2A to 2C, cross-sectional views illustrating a method for manufacturing an electronic package 2 in accordance with the present disclosure are shown.

As shown in FIG. 2A, an electronic component 21 and a carrier structure 20 including a plurality of electrical contact pads 200 are provided. A plurality of conductive bumps 22 are formed on the electronic component 21. A solder tip 23 is formed on each of the conductive bumps 22. The carrier structure 20 then undergoes a pre-heating process, such that the carrier structure 20 may appear to be warped, and, thus, its left and right sides are upturned (as indicated by arrows B in FIG. 2A).

In an embodiment, the electronic component 21 can be an active component, a passive component, or a combination thereof. The active component can be, for example, a semiconductor chip. The passive component can be, for example, a resistor, a capacitor or an inductor. In an embodiment, the electronic component 21 is a semiconductor chip having an active face 21a and a non-active face 21b opposite to the active face 21a. A plurality of electrode pads are provided on the active face 21a. The conductive bumps 22, such as copper pillars, are disposed on the electrode pads. The solder tips 23 are not reflowed.

Moreover, the conductive bumps 22 or the solder tips 23 are formed by electroplating or screen printing, for example, and the thickness t of the solder tips 23 is greater than or equal to 15 μm.

Furthermore, the solder tip 23 may be, for example, cylindrical, cubic, or some other shapes with a generally planar, arc or irregular surface.

In an embodiment, the carrier structure 22 can be, for example, a package substrate with a core layer and circuit structures, or a coreless circuit structure, which forms circuit layers, such as a fan-out redistribution layer (RDL), on a dielectric material. It can be appreciated that the carrier structure 20 can also be other types of carrier for carrying an electronic component (e.g., a chip), such as a lead frame and a silicon interposer, and the present disclosure is not limited as such.

As shown in FIG. 2B, heat is provided to the electronic component 21 (a pre-heating process) to allow the solder tips 23 to be melted, and the melted solder tips 23' are directly bonded with the electrical contact pads 200 on the carrier structure 20 afterwards, such that the solder tips 23 did not go through a reflow process before coming into contact with the carrier structure 20 (or the electrical contact pads 200).

In an embodiment, the electronic component 21 and the carrier structure 20 can undergo the pre-heating process at different (or the same) locations simultaneously.

As shown in FIG. 2C, a cooling process is performed to allow the carrier structure 20 to gradually flatten.

In another embodiment, the electronic component 21 and the carrier structure 20 are not pre-heated. The solder tips 23 are directly brought into contact with the electrical contact pads 200 (as shown in FIG. 2B') followed by heating of the electronic component 21 (e.g., a heating process) in order to allow the solder tips 23 to become melted, such that the melted solder tips 23' are bonded onto the electrical contact pads 200 (as shown in FIG. 2C).

As described above, the electroplating thickness of the prior-art solder tips is limited in that, when the thickness of the solder tips is less than 15 μm, solder cracks may occur in the reflowed bullet-shaped solder balls owing to the inability to sustain the deformation of the carrier structure, whereas when the thickness of the solder tips is greater than or equal to 15 reflowed solder balls are more likely to collapse. On the contrary, the method for manufacturing the electronic package 2 in accordance with the present disclosure allows the solder tips 23 to come into contact with the carrier structure 20 without the reflow process. As a result, sufficient amount of solder tips 23 can be provided on the conductive bumps 22 without having to worry about the risk of solder collapsing at the solder tips 23 and covering the side walls of the conductive bumps 22. Therefore, compared to the prior art, the method for manufacturing the electronic package 2 according to the present disclosure eliminates unbalanced stress in the subsequent processes, thereby preventing solder cracks from forming in the conductive bumps 22 or the solder tips 23'.

Moreover, a sufficient amount of solder in the solder tips 23 provides better bonding during thermal cycling (e.g., the pre-heating or heating process) to preclude the problem of cracking during the cooling process due to insufficient amount of solder used in the solder tips 23.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. A method for manufacturing an electronic package, comprising:
    providing an electronic component and a carrier structure, with a plurality of conductive bumps formed on the electronic component and a solder tip formed on each of the conductive bumps;
    pre-heating the carrier structure to allow the carrier structure to become warped; and
    after pre-heating the carrier structure, bonding the electronic component to the carrier structure via the solder tips with the solder tips being brought into contact with the carrier structure and free from going through a reflow process.

2. The method of claim 1, wherein the electronic component is a semiconductor chip.

3. The method of claim 1, wherein the electronic component is a flip chip semiconductor chip.

4. The method of claim 1, further comprising, after the solder tips are brought into contact with the carrier structure, performing a cooling process.

5. The method of claim 1, further comprising, after the solder tips are brought into contact with the carrier structure, heating the electronic component to allow the solder tips to become melted.

6. The method of claim 1, wherein at least one of the conductive bumps and the solder tips is formed by electroplating.

7. The method of claim 1, wherein at least one of the conductive bumps and the solder tips is formed by screen printing.

8. The method of claim 1, wherein the solder tips have a thickness greater than or equal to 15 μm.

9. The method of claim 1, wherein the solder tips are cylindrical or cubic.

10. The method of claim 1, wherein the solder tips have planar, arc or irregular surfaces.

11. The method of claim 1, wherein the carrier structure is a package substrate with a core layer and circuit structures.

12. The method of claim 1, wherein the carrier structure is a coreless circuit structure, a lead frame, or a silicon interposer.

* * * * *